United States Patent
Southard et al.

(10) Patent No.: US 11,617,279 B2
(45) Date of Patent: Mar. 28, 2023

(54) BRAKE FOR AN ELECTRONIC COMPONENT

(71) Applicant: Raytheon Company, Waltham, MA (US)

(72) Inventors: Todd E. Southard, Bolton, CT (US); Caroline Manteiga, North Andover, MA (US); Dennis Proulx, North Grosvenordale, CT (US); Joseph R. Ellsworth, West Boylston, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/407,923

(22) Filed: Aug. 20, 2021

(65) Prior Publication Data

US 2023/0058479 A1   Feb. 23, 2023

(51) Int. Cl.
*H05K 7/14*      (2006.01)
*F16D 59/00*    (2006.01)
*F16D 63/00*    (2006.01)

(52) U.S. Cl.
CPC ........... *H05K 7/1417* (2013.01); *F16D 59/00* (2013.01); *F16D 63/00* (2013.01)

(58) Field of Classification Search
CPC .................................................. H05K 7/1417
See application file for complete search history.

(56) References Cited

U.S. PATENT DOCUMENTS

| | | | |
|---|---|---|---|
| 4,002,386 A | 1/1977 | McKenzie | |
| 6,490,153 B1 * | 12/2002 | Casebolt | G11B 33/128 361/679.33 |
| 8,023,263 B2 | 9/2011 | Crippen | |
| 10,462,922 B2 | 10/2019 | Moreau | |
| 10,791,647 B1 * | 9/2020 | Miyamura | H05K 7/20272 |
| 2018/0197580 A1 | 7/2018 | Okamoto | |

OTHER PUBLICATIONS

International search report for PCT/US2022/040902 dated Nov. 30, 2022.

* cited by examiner

*Primary Examiner* — Mukundbhai G Patel
(74) *Attorney, Agent, or Firm* — Getz Balich LLC

(57) ABSTRACT

An assembly is provided for an electronic system. This electronic system includes a base and an electronic component. The base includes a base connector, a bay and a first guide. The first guide is arranged along a first side of the bay. The electronic component is configured to mate with the first guide and to move along the first guide within the bay to an installed position. The electronic component includes a component connector and a brake. The component connector is configured to couple with the base connector when the electronic component is at the installed position. The brake is engageable as the electronic component moves along the first guide to the installed position.

20 Claims, 10 Drawing Sheets

BRAKE FOR AN ELECTRONIC COMPONENT

BACKGROUND OF THE DISCLOSURE

1. Technical Field

This disclosure relates generally to electronics and, more particularly, to arranging an electronic component with a base such as an array structure.

2. Background Information

Electronics such as a radar system may include a base (e.g., an array structure) and a plurality of electronic components (e.g., radio frequency transmit/receive modules) arranged within a component bay of the base. Various arrangements are known in the art for positioning and/or retaining the electronic components within the component bay. While these known arrangements have various benefits, there is still room in the art for improvement.

SUMMARY OF THE DISCLOSURE

According to an aspect of the present disclosure, an assembly is provided for an electronic system. This electronic system includes a base and an electronic component. The base includes a base connector, a bay and a first guide. The first guide is arranged along a first side of the bay. The electronic component is configured to mate with the first guide and to move along the first guide within the bay to an installed position. The electronic component includes a component connector and a brake. The component connector is configured to couple with the base connector when the electronic component is at the installed position. The brake is engageable as the electronic component moves along the first guide to the installed position.

According to another aspect of the present disclosure, another assembly is provided for an electronic system. This electronic system includes an electronics base and an electronic component. The electronics base includes a base connector and a bay. The electronic component includes a component connector, a brake and a handle assembly. The component connector is configured to couple with the base connector when the electronic component is within the electronics base. The brake is configured to hold a position of the electronic component within the bay. The brake is actuatable by squeezing the handle assembly.

According to still another aspect of the present disclosure, a method is provided for servicing an electronic system. During this method, an electronic component is provided within a bay of an electronic base. The electronics base includes a base connector and a first guide. The electronic component includes a component connector, a brake and a handle assembly. The component connector is configured to couple with the base connector when the electronic component is at an installed position. The electronic component is configured to move along the first guide within the bay to the installed position. The handle assembly is squeezed to disengage the brake and permit movement of the electronic component within the bay.

The handle assembly may include a handle base, a handle lever and a spring device. The handle lever may be pivotally connected to the handle base by a pivot connection. The spring device may be located to a first side of the pivot connection. The spring device may be engaged with and between the handle base and the handle lever. The brake may be configured with the handle lever and located to a second side of the pivot connection.

The brake may be configured to permit movement of the electronic component within the bay when the handle base and the handle lever are squeezed together on the first side of the pivot connection.

The brake may be configured to hold the position of the electronic component within the bay when the electronic component is at an installed position where the component connector is coupled with the base connector. The brake may also or alternatively be configured to hold the position of the electronic component within the bay when the electronic component is at an uninstalled position where the component connected is uncoupled from the base connector.

When the brake is engaged, the brake may be configured to positionally fix the electronic component within the bay.

The brake may be configured to hold the electronic component at an uninstalled position along the first guide. The component connector may be uncoupled from the base connector when the electronic component is at the uninstalled position.

The brake may be configured to hold the electronic component at the installed position.

The electronic component may also include a handle assembly. The brake may be actuatable by squeezing the handle assembly.

The electronic component may also include a handle assembly. The brake may be disengageable by squeezing the handle assembly.

When the brake is engaged, the brake may be configured to allow movement of the electronic component along the first guide towards the installed position. When the brake is engaged, the brake may also or alternatively be configured to prevent movement of the electronic component along the first guide away from the installed position.

The brake may be configured to disengage when the electronic component is pushed along the first guide towards the installed position.

When the brake is engaged, the brake may be configured to press against a surface of the base at the first side of the bay.

The electronic component may also include a handle base, a handle lever and a biasing device. The handle lever may be pivotally connected to the handle base at an intermediate position between a first end of the handle lever and a second end of the handle lever. The handle lever may include the brake at the first end of the handle lever. The biasing device may be engaged with and located between the handle base and the handle lever at the second end of the handle lever.

The brake may include a friction pad.

The base may include a rack configured to hold a plurality of electronic modules within the bay. The electronic component may be configured as or otherwise include a first of the plurality of electronic modules.

The base may also include a second guide arranged along a second side of the bay. The electronic component may be configured to mate with the second guide and to move along the second guide within the bay to the installed position.

The first guide may be or otherwise include a slot. The electronic component may also include a slider that projects into and is slidable within the slot when the electronic component is mated with the first guide.

The first guide may be angularly offset from a gravitational horizon line by an acute angle.

The present disclosure may include any one or more of the individual features disclosed above and/or below alone or in any combination thereof.

The foregoing features and the operation of the invention will become more apparent in light of the following description and the accompanying drawings.

DETAILED DESCRIPTION

Figure 1:
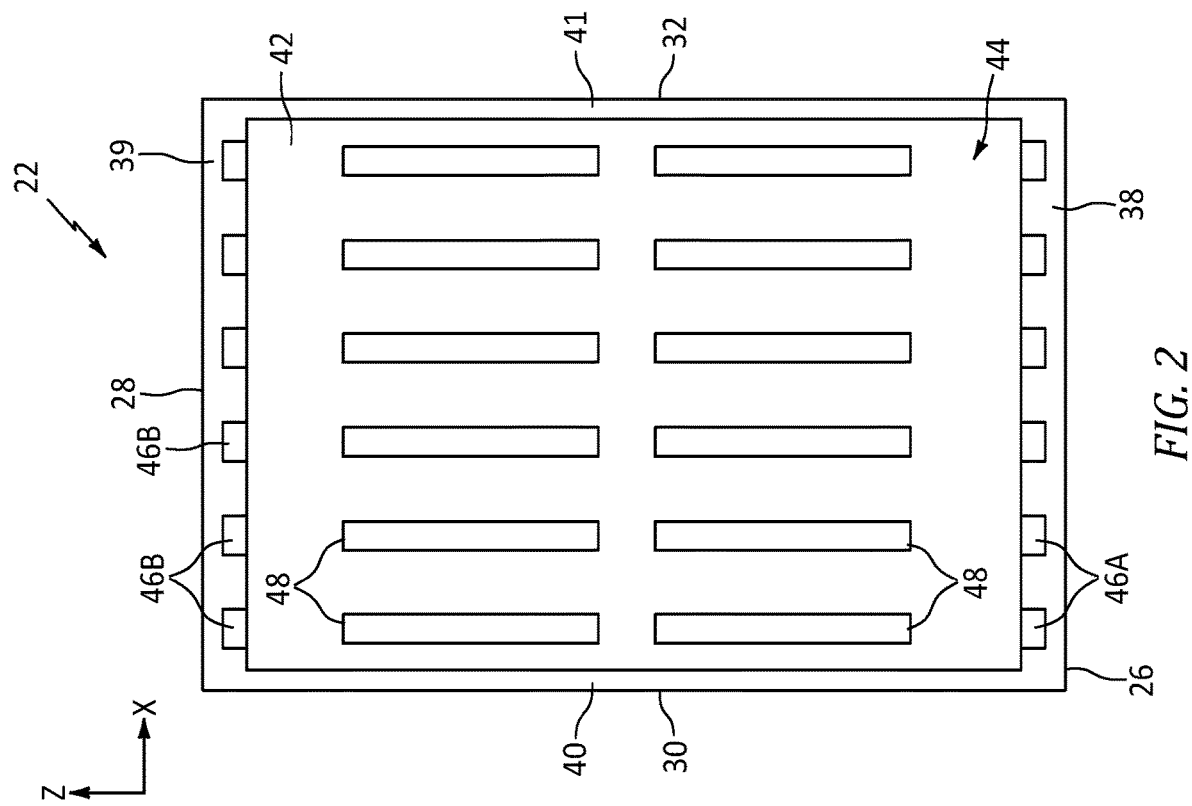
FIG. 1 is an illustration of a front side of an assembly for an electronic system.

FIG. 1 illustrates an assembly 20 for an electronic system; e.g., a computer system. This electronic system may be configured as or included as part of a sensor system such as, but not limited to, a radar system. The present disclosure, however, is not limited to such an exemplary electronic system application. The electronic system of the present disclosure, for example, may also or alternatively be configured as or included as part of a control system, a server, a communication system, a data storage system or a supercomputer. The electronic system assembly 20 of FIG. 1 includes an electronics base 22 and one or more electronic components 24.

The electronics base 22 is configured as a mounting structure for the electronic components 24. The electronics base 22, for example, may be configured as an array structure, a rack and/or a base station for the electronic components 24.

Figure 2:
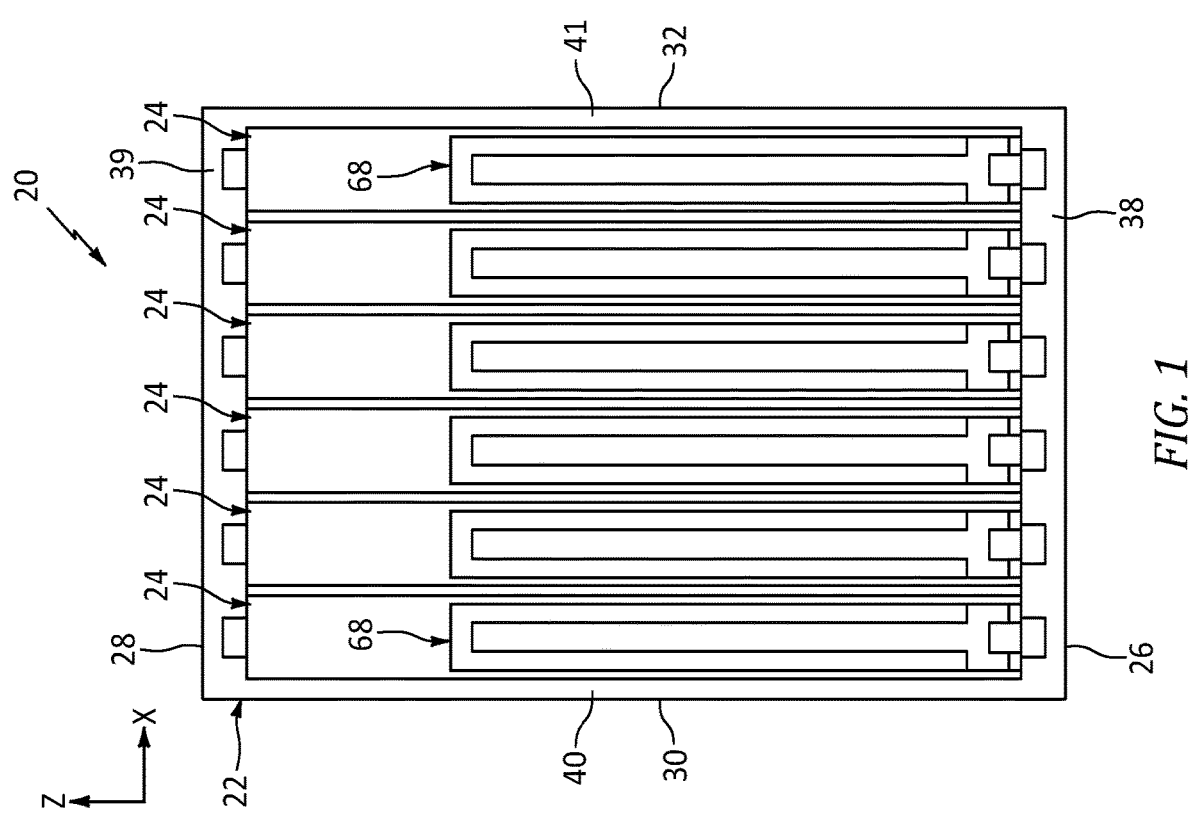
FIG. 2 is an illustration of a front side of an electronics base.
Figure 3:
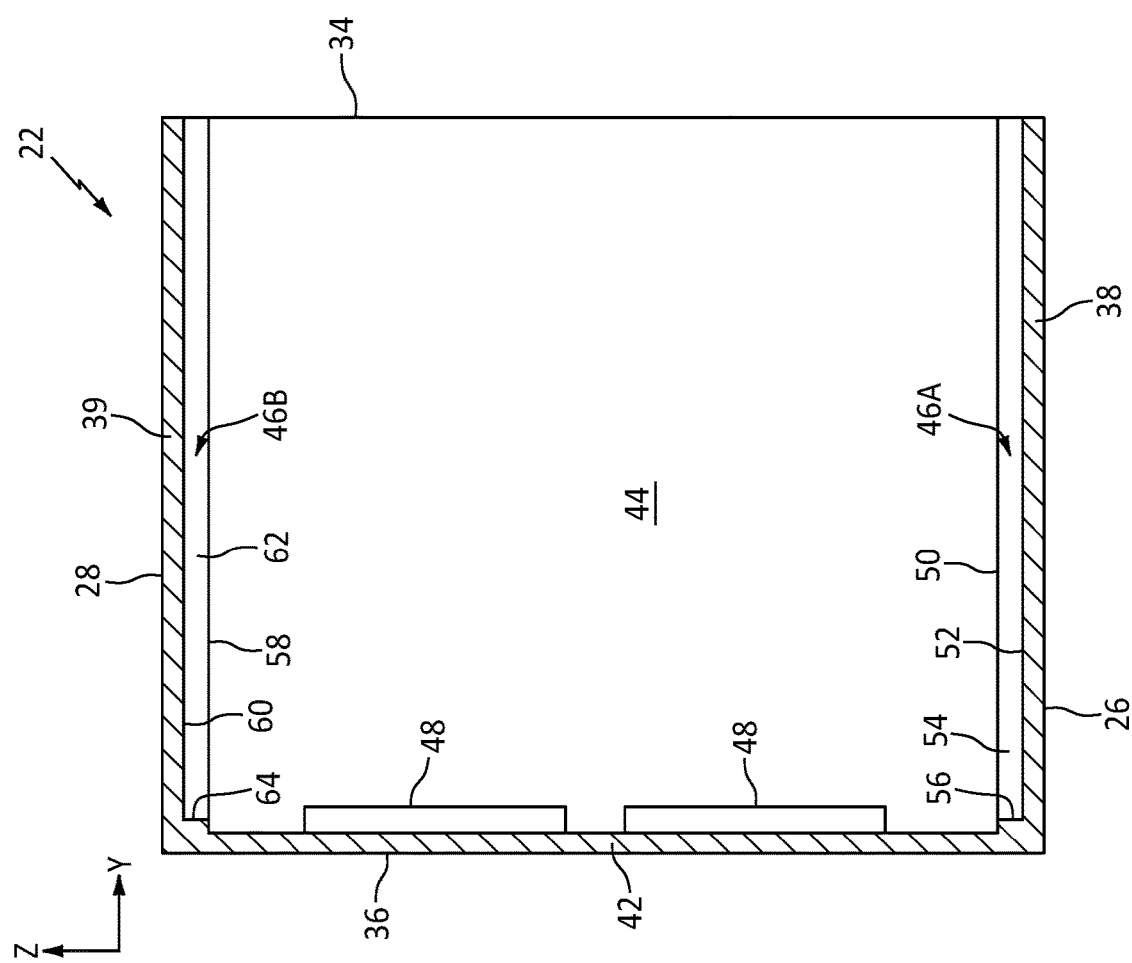
FIG. 3 is a side sectional illustration of the electronics base.

Referring to FIG. 2, the electronics base 22 extends vertically (e.g., along a z-axis) between and to a bottom side 26 of the electronics base 22 and a top side 28 of the electronics base 22. The electronics base 22 extends laterally (e.g., along an x-axis) between and to a first side 30 of the electronics base 22 and a second side 32 of the electronics base 22. Referring to FIG. 3, the electronics base 22 extends longitudinally (e.g., along a y-axis) between and to a front (e.g., access) side 34 of the electronics base 22 and a back side 36 of the electronics base 22.

Referring to FIGS. 2 and 3, the electronics base 22 includes a plurality of walls 38-42 and a component bay 44 (e.g., an internal cavity). The bottom wall 38 (e.g., a component shelf) is located at (e.g., on, adjacent or proximate) the base bottom side 26. The top wall 39 is located at the base top side 28. The first side wall 40 is located at the base first side 30. The second side wall 41 is located at the base second side 32. The back wall 42 is located at the base back side 36. The bottom wall 38, the top wall 39 and the back wall 42 each extend laterally between and are connected to the first side wall 40 and the second side wall 41. The first side wall 40, the second side wall 41 and the back wall 42 each extend vertically between and are connected to the bottom wall 38 and the top wall 39. The bottom wall 38, the top wall 39, the first side wall 40 and the second side wall 41 each extends longitudinally from the base front side 34 to the back wall 42.

The component bay 44 is formed by the electronics base walls 38-42. The component bay 44 of FIGS. 2 and 3, for example, projects longitudinally into the electronics base 22 from the base front side 34 to the back wall 42. The component bay 44 extends laterally within the electronics base 22 between and to the first side wall 40 and the second side wall 41. The component bay 44 extends vertically within the electronics base 22 between and to the bottom wall 38 and the top wall 39.

The electronics base 22 of FIGS. 2 and 3 also includes one or more component guides 46A and 46B (generally referred to as "46") and one or more base connectors 48. Examples of the base connectors 48 include, but are not limited to, electronic input/output terminals, electrical couplings, electrical plugs, electrical receptacles, etc. These base connectors 48 are arranged at the back wall 42.

The component guides 46 are configured to guide movement of the electronic components 24 (see FIG. 1) within the component bay 44 as described below in further detail. Some of the component guides 46A are arranged at the bottom wall 38, which guides 46A may be referred to below as bottom guides. Some of the component guides 46B are arranged at the top wall 39, which guides 46B may be referred to below as top guides.

Figure 4:
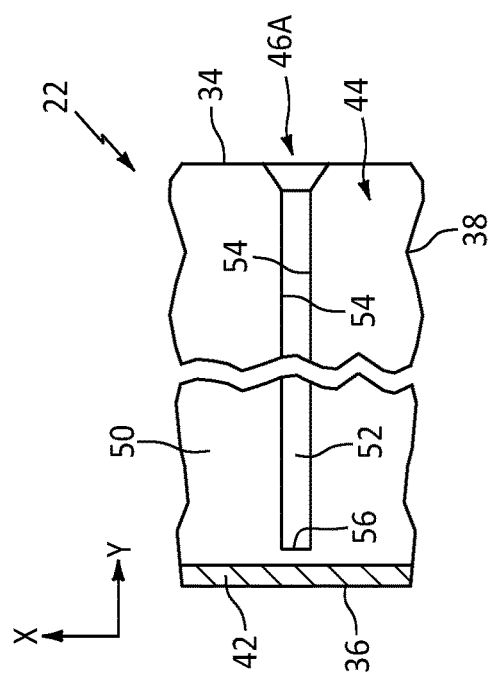
FIG. 4 is an illustration of a portion of a bottom wall of the electronics base.

Each of the bottom guides 46A of FIGS. 3 and 4 is configured as a slot. This bottom guide 46A projects vertically into the bottom wall 38 from an internal surface 50 of the bottom wall 38 to a bottom 52 of the bottom guide 46A, where the internal surface 50 forms a peripheral boundary of the component bay 44. The bottom guide 46A extends laterally within the bottom wall 38 between opposing sides 54 of the bottom guide 46A. The bottom guide 46A projects longitudinally into the bottom wall 38 from the base front side 34 to an end 56 of the bottom guide 46A at (or about) the back wall 42. The bottom guide 46A of FIG. 4 may include a flared end portion at the base front side 34.

Figure 5:
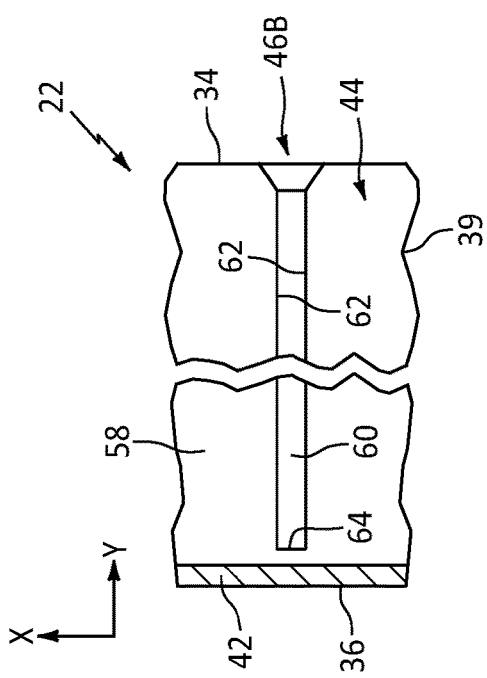
FIG. 5 is an illustration of a portion of a top wall of the electronics base.

Each of the top guides 46B of FIGS. 3 and 5 is configured as a slot. This top guide 46B projects vertically into the top wall 39 from an internal surface 58 of the top wall 39 to a top 60 of the top guides 46B, where the internal surface 58 forms a peripheral boundary of the component bay 44. The top guide 46B extends laterally within the top wall 39 between opposing sides 62 of the top guides 46B. The top guide 46B projects longitudinally into the top wall 39 from the base front side 34 to an end 64 of the top guide 46B at (or about) the back wall 42. The top guide 46B of FIG. 5 may include a flared end portion at the base front side 34.

Figure 6:
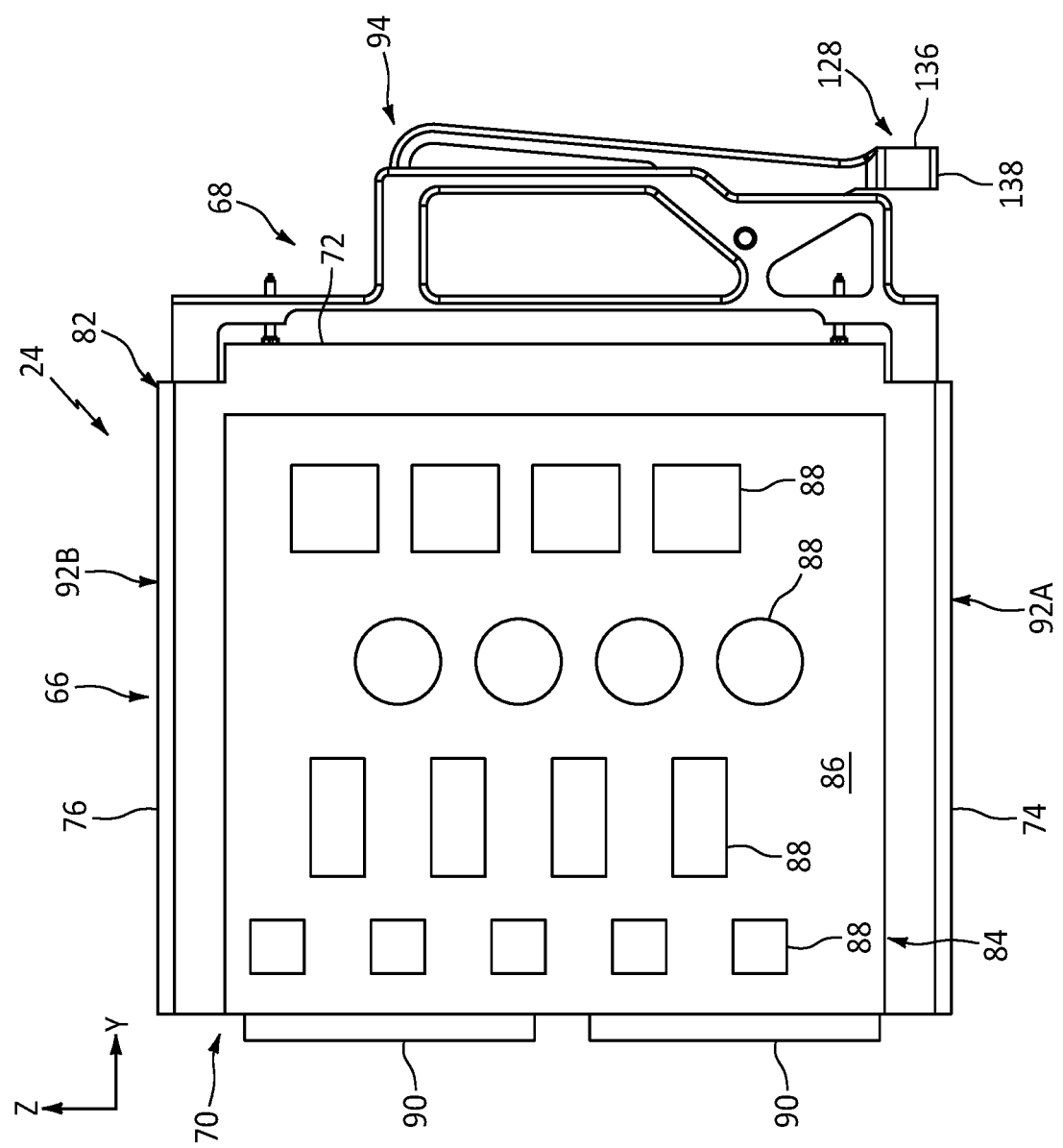
FIG. 6 is an illustration of a side of an electronic component.

Each of the electronic components 24 of FIG. 1 is configured as a module and/or a cartridge for the electronics base 22; e.g., a line replaceable unit (LRU). Referring to FIG. 6, each of the electronic components 24 includes an electronic component base 66 and a handle assembly 68.

Figure 7:
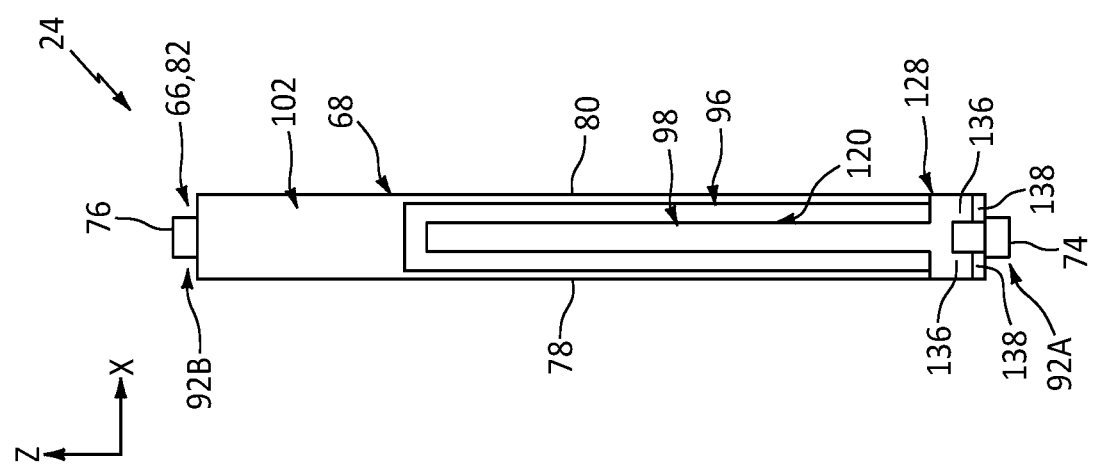
FIG. 7 is an illustration of an exterior end of the electronic component.

The component base 66 of FIG. 6 extends longitudinally between and to an interior end 70 of the electronic component 24 and an exterior end 72 of the component base 66. The component base 66 extends vertically between and to a bottom side 74 of the electronic component 24 and a top side 76 of the electronic component 24. Referring to FIG. 7, the component base 66 extends laterally between a first side 78 of the electronic component 24 and a second side 80 of the electronic component 24.

Referring again to FIG. 6, the component base 66 may be configured as an electronic radio frequency transmit/receive module. This component base 66 of FIG. 6, for example, includes a frame 82 and electronics 84 mounted to the frame 82. The electronics 84 may include at least one printed circuit board 86 (PCB) configured with one or more circuit elements 88; e.g., electronic devices. Each of the circuit elements 88 is electrically coupled with one or more respective conductive paths (e.g., tracks) on the printed circuit board 86. Examples of the circuit elements 88 include, but are not limited to, processing device(s), memory device(s), resistor(s), capacitor(s), transistor(s), inductor(s), diode(s), switch(es), input device(s), output device(s), etc. The electronics 84 also include one or more component connectors 90; e.g., electronic input/output terminals, electrical couplings, electrical plugs, electrical receptacles, etc. These component connectors 90 are arranged at and vertically along the component interior end 70.

The frame 82 includes one or more sliders 92A and 92B (generally referred to as "92"). Each of these sliders 92 may be configured as a protrusion such as, but not limited to, a lug or a rail. The bottom slider 92A is disposed at and extends longitudinally along the component bottom side 74. The top slider 92B is disposed at and extends longitudinally along the component top side 76.

Figure 8:
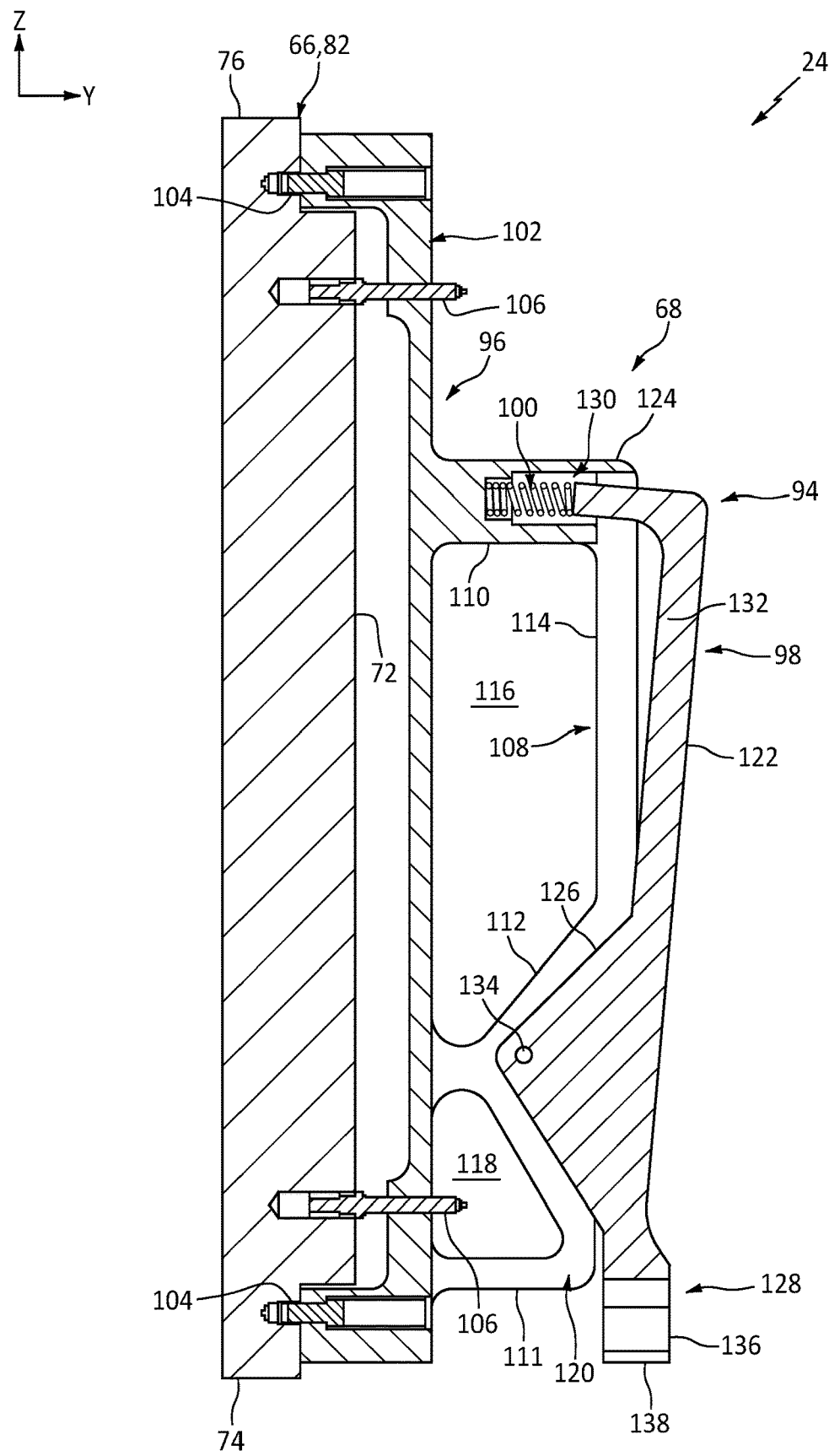
FIG. 8 is a side sectional illustration of an end portion of the electronic component at the exterior end.

Referring to FIG. 8, the handle assembly 68 is arranged at an exterior end 94 of the electronic component 24. This handle assembly 68 of FIG. 8 includes a handle base 96, a handle lever 98 and a biasing device 100 (e.g., a spring such as a coil spring).

The handle base 96 is connected to the component base 66 at the base exterior end 72. A component mount 102 of the handle base 96 of FIG. 8, for example, is mechanically attached to the frame 82 by one or more fasteners 104; e.g., bolts. The component mount 102 may be aligned with the frame 82 via one or more guide pins 106. The present disclosure, however, is not limited to any particular handle base attachment techniques. For example, in other embodiments, the handle base 96 may be bonded to the frame 82 or formed as an integral part of the frame 82.

Figure 9:
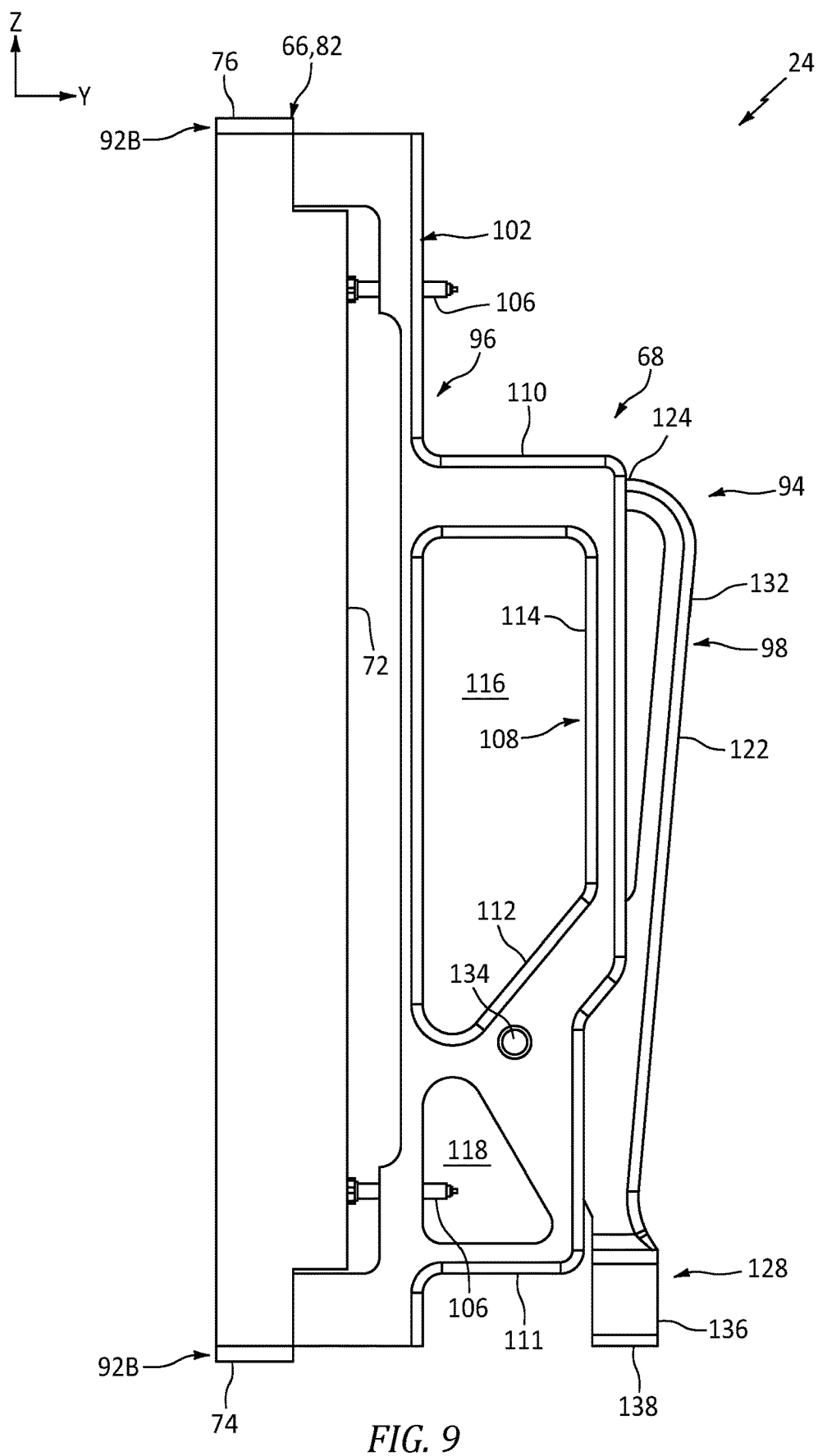
FIG. 9 is an illustration of a side of an end portion of the electronic component at the exterior end.

The handle base 96 of FIG. 9 includes a handle 108 and one or more spacers 110-112; e.g., offsets, handle supports, handle mounts, etc. The handle 108 is connected to the component mount 102 by the spacers 110-112. More particularly, each of the spacers 110-112 extends longitudinally from the handle 108 to the component mount 102. The top spacer 110 is disposed at a top end of the handle 108. The bottom spacer 111 is disposed at a bottom end of the handle 108. The intermediate spacer 112 is disposed vertically between and displaced vertically from the top spacer 110 and the bottom spacer 111. The handle 108 includes a grip 114 vertically between the top spacer 110 and the intermediate spacer 112.

The handle base 96 of FIG. 9 is configured with one or more apertures 116 and 118. The first aperture 116 (e.g., a top aperture, a handle aperture) extends laterally through the handle base 96. This first aperture 116 extends longitudinally within the handle base 96 between and to the component mount 102 and the grip 114. The first aperture 116 extends vertically within the handle base 96 between and to the top spacer 110 and the intermediate spacer 112. This first aperture 116 is configured to form an opening for an operator hand to pass through.

The second aperture 118 (e.g., a bottom aperture) extends laterally through the handle base 96. This second aperture 118 extends longitudinally within the handle base 96 between and to the component mount 102 and the handle 108. The second aperture 118 extends vertically within the handle base 96 between and to the bottom spacer 111 and the intermediate spacer 112. This second aperture 118 may be sized relatively small such that it is difficult or impossible for receive an operator hand. By contrast, the first aperture 116 is sized to comfortably receive an operator hand as described above.

The handle base 96 of FIG. 8 is also configured with a slot 120 (see also FIG. 7). This slot 120 projects longitudinally into the handle base 96 from an exterior end of the handle base 96 to the component mount 102. The slot 120 extends vertically through the bottom spacer 111, laterally dividing the bottom spacer 111 into side segments. The slot 120 extends vertically through the intermediate spacer 112, laterally dividing the intermediate spacer 112 into side segments. The slot 120 further projects vertically into the handle 108 from a bottom side of the handle 108, laterally dividing the handle 108 into side segments. This slot 120 is configured to form a receptacle for the handle lever 98 (see also FIG. 7).

The handle lever 98 of FIG. 8 includes a lever base 122 (e.g., a beam, a spine, etc.), a plunger 124, a lever mount 126 and a brake 128. The plunger 124 is disposed at a top end of the handle lever 98. The plunger 124 projects longitudinally out from the lever base 122. More particularly, the plunger 124 projects partially into a bore 130 (e.g., a biasing device receptacle) in the handle base 96 and its top spacer 110, where the biasing device 100 is also disposed within the bore 130 longitudinally between and engaged with the top spacer 110 and the plunger 124.

The lever mount 126 is vertically displaced from the plunger 124 by a grip 132 of the lever base 122. The lever mount 126 is disposed at an intermediate location along the lever base 122. The lever mount 126 is arranged within the slot 120 between the intermediate spacer 112 segments. The lever mount 126 is pivotally connected to the intermediate spacer 112 and its segments by a pivot connection 134 (e.g., a pin connection), which thereby pivotally connects the handle lever 98 to the handle base 96.

Figure 10:
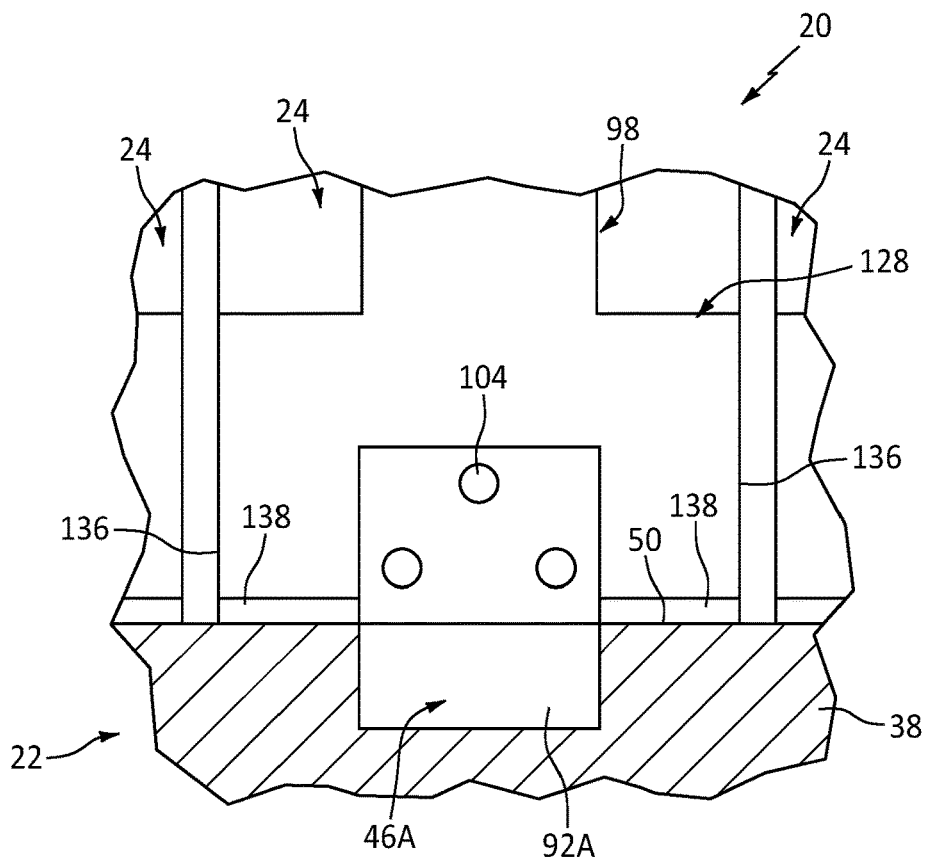
FIG. 10 is a sectional illustration of a portion of the electronic system assembly where a brake is engaged with a wall of the electronics base.

The brake 128 is disposed at a bottom end of the handle lever 98. Referring to FIG. 10, the brake 128 may include one or more brake lugs 136. Each of these brake lugs 136 may be configured with a brake pad 138; e.g., a friction pad. This brake pad 138 may be configured for replacement. The brake pad 138, for example, may be removably attached to the respective brake lug 136 via a mechanical connection or a removable bond connection. The brake pad 138 may be constructed from a high friction material. An example of the high friction material is a polymer such as, but not limited to, rubber. The brake pad 138, however, may alternatively be constructed from other high friction materials; e.g., brake composites, etc.

Figure 11:
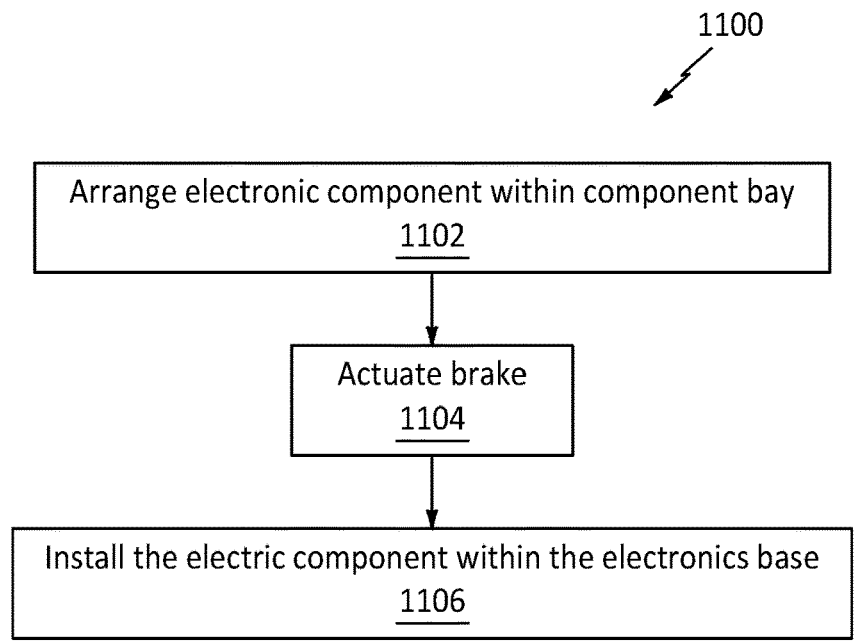
FIG. 11 is a flow diagram of a method for servicing the electronic system.

FIG. 11 is a flow diagram of a method 1100 for servicing an electronic system. For ease of description, this method 1100 is described with reference to the electronic system assembly 20 described above. The method 1100 of the present disclosure, however, may also be performed with other electronic system assemblies.

Figure 12:
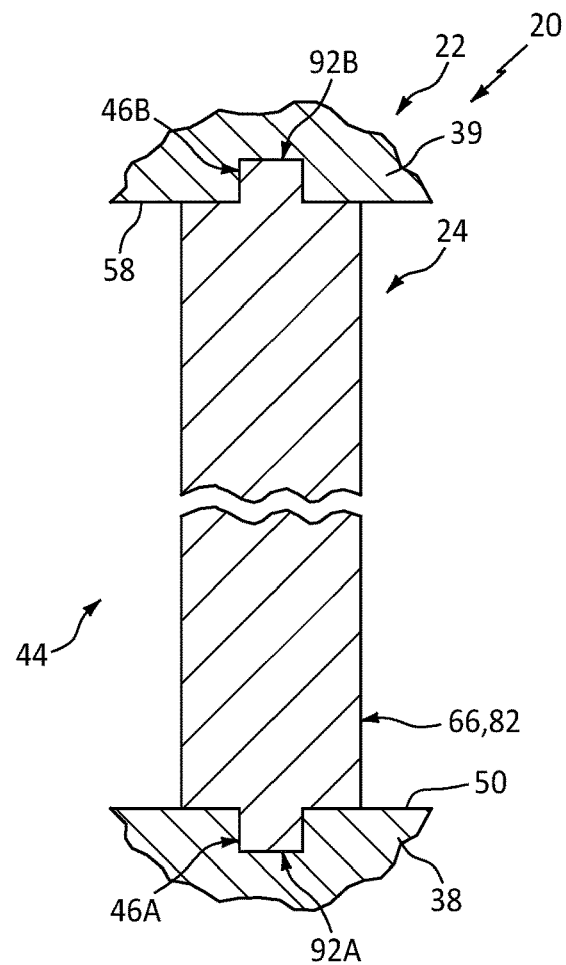
FIG. 12 is a schematic sectional illustration of the electronic component mated with guides within a component bay of the electronics base.
Figure 13:
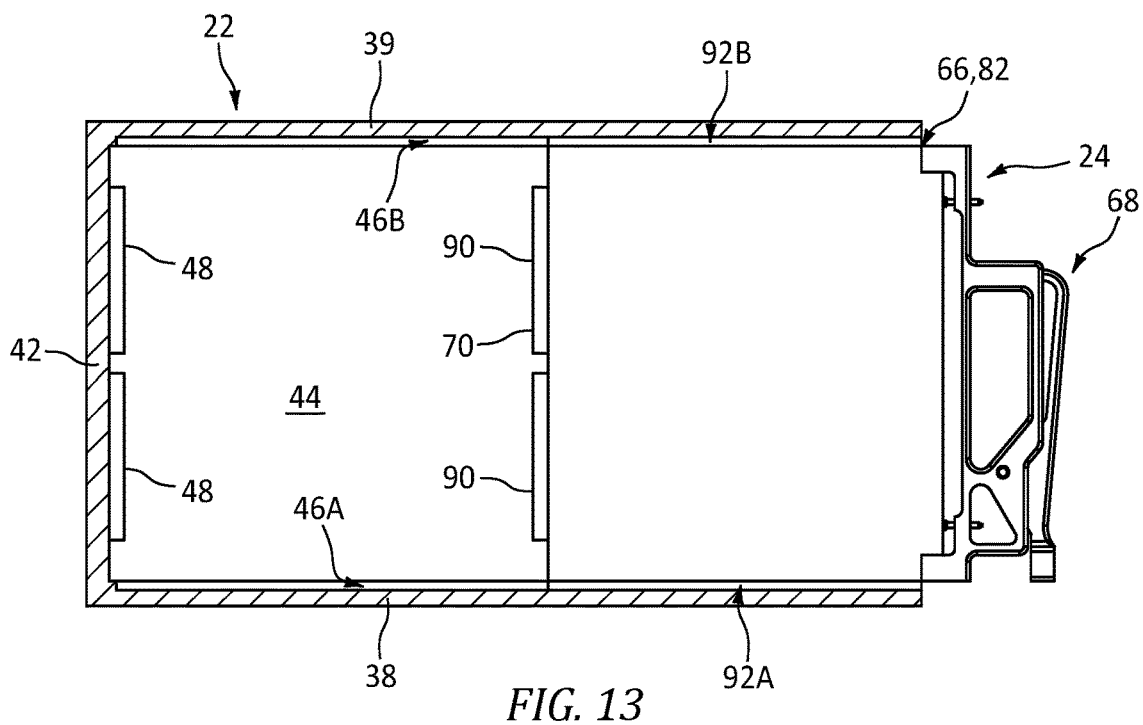
FIGS. 13-16 are side sectional illustrations of the electronic system assembly depicting installation of the electronic component with the electronics base.

In step 1102, a respective one of the electronic components 24 is arranged within the component bay 44. For example, referring to FIGS. 12 and 13, the component interior end 70 is inserted longitudinally through an opening of the electronics base 22 into the component bay 44. The top slider 92B is mated with the top guide 46B. More particularly, the top slider 92B is aligned with and inserted longitudinally into the top guide 46B, where the top slider 92B projects vertically out from the frame 82 and into the top guide 46B. The bottom slider 92A is mated with the bottom guide 46A. More particularly, the bottom slider 92A is aligned with and inserted longitudinally into the bottom guide 46A, where the bottom slider 92A projects vertically out from the frame 82 and into the bottom guide 46A. A hand of an operator (e.g., a technician) may grab the handle assembly 68 of FIG. 13, and push against the handle assembly 68 until the entire component base 66 is received within the component bay 44.

Figure 14:
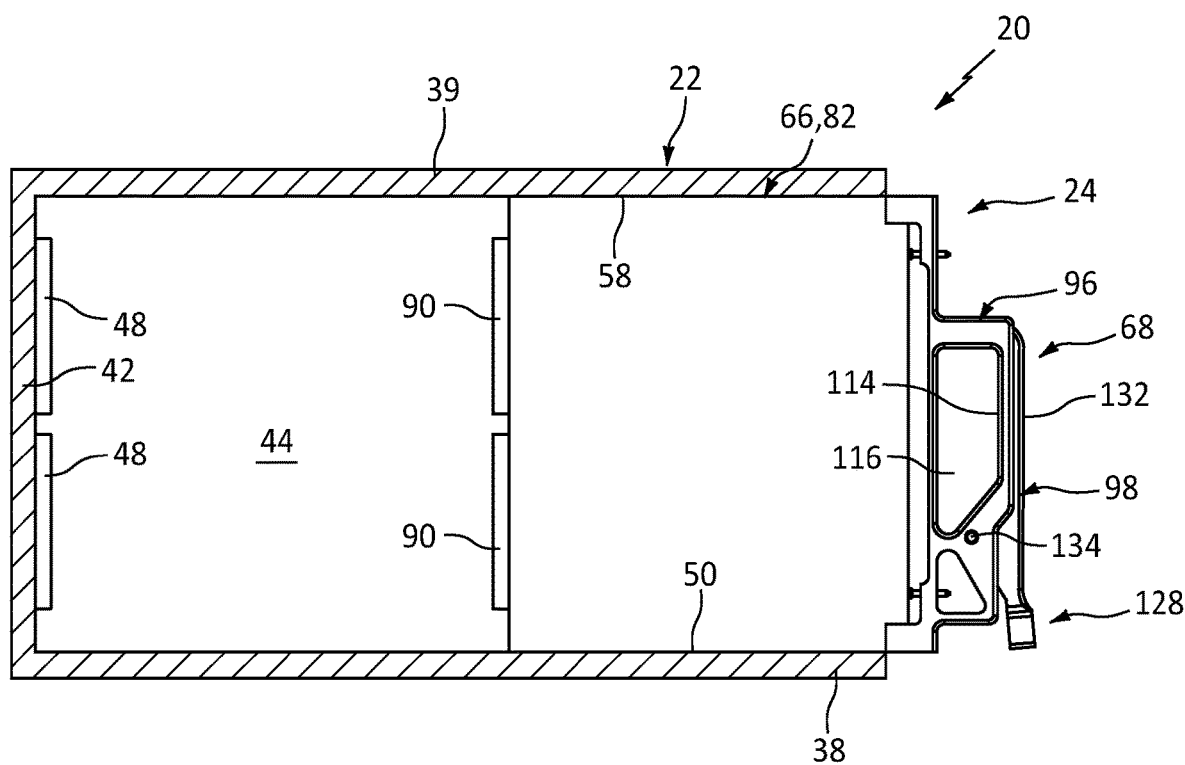

In step 1104, the brake 128 is actuated; e.g., disengaged. For example, referring to FIG. 14, the operator may squeeze the handle assembly 68. More particularly, the grips 114 and 132 may be squeezed together such that the brake 128 pivots upwards; e.g., compare to brake 128 arrangement in FIG. 13.

In step 1106, the electronic component 24 is installed within the electronics base 22. For example, while the brake 128 is disengaged, the operator may push against the handle assembly 68 to move (e.g., slide) the electronic component 24 along the guides 46 (see FIGS. 12 and 13) to an installed position as shown, for example, in FIG. 15. At this installed position of FIG. 15, each of the component connectors 90 is mated with (e.g., electrically coupled with) a respective one of the base connectors 48. The electronic component 24 may thereby be placed in signal communication with the electronics base 22 and/or other components of the electronic system.

Figure 15:
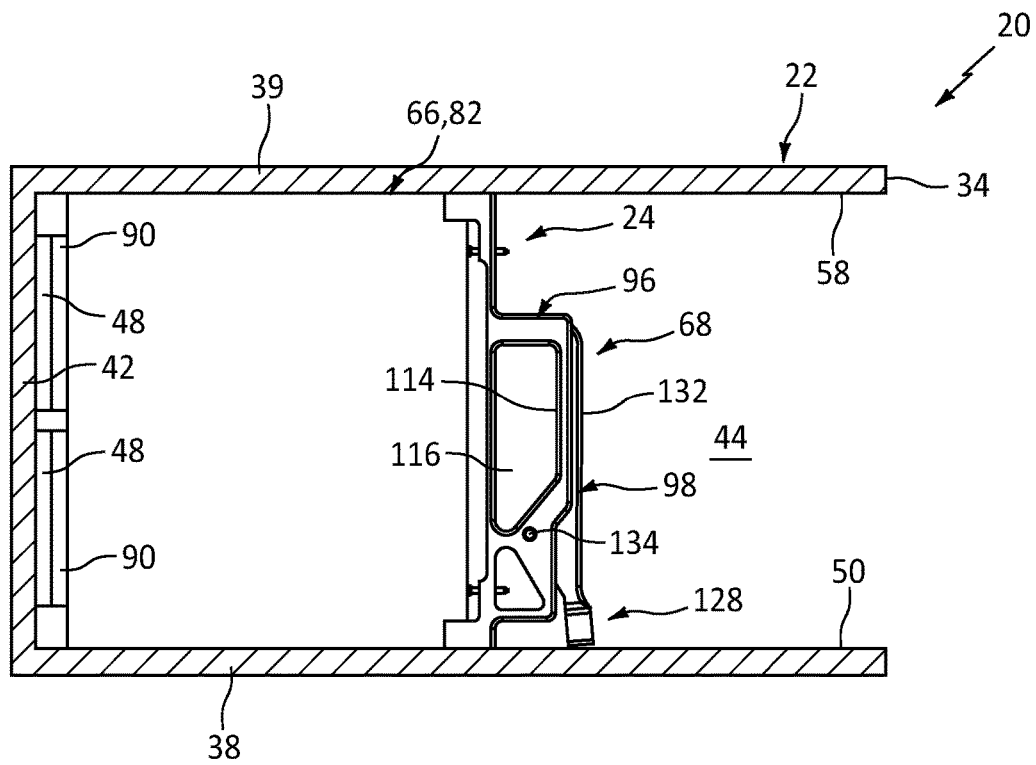
Figure 16:
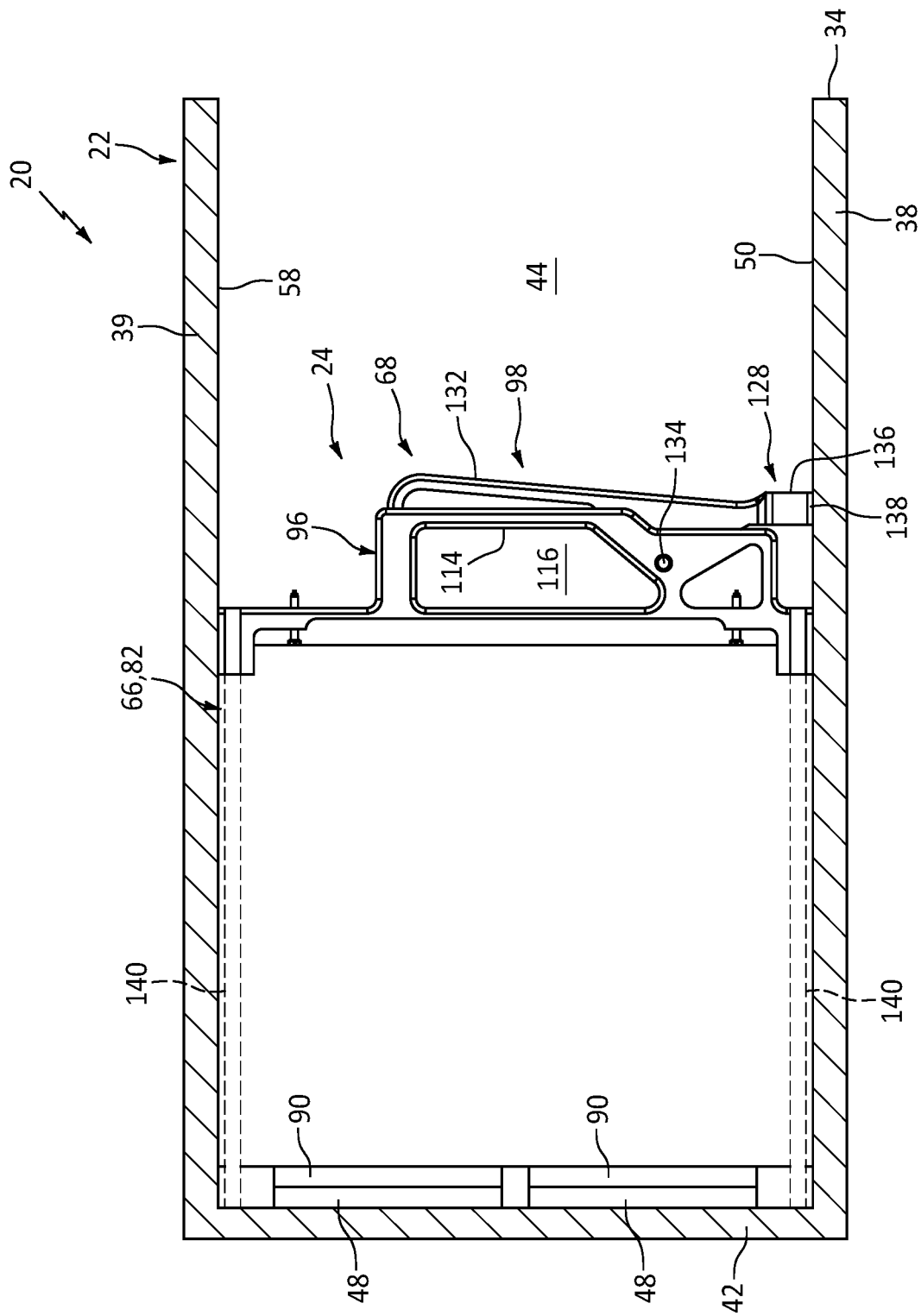

Once the electronic component 24 is at the installed position of FIG. 15, the operator may release the handle assembly 68. By releasing the handle assembly 68 and/or no longer pushing against the grip 132, the biasing device 100 of FIG. 8 pushes the plunger 124 away from the top spacer 110. Referring to FIG. 16, the handle lever 98 thereby pivots about a pivot axis of the pivot connection 134 (e.g., clockwise in FIG. 16) and causes the brake 128 and its brake pads 138 to engage (e.g., contact) the bottom wall surface 50. Thus, by releasing (e.g., no longer squeezing) the handle assembly 68 and/or by releasing (e.g., no longer pushing against) the grip 132, the brake 128 automatically engages and is operable to hold (e.g., retain, secure, fix) the electronic component 24 at its current position; here, the installed position. The brake 128 may be configured as the only retention mechanism for the electronic component 24. Alternatively, the electronic component 24 of FIG. 16 (see also FIG. 10) may be further attached to the electronics base 22 using, for example, one or more fasteners 140 (schematically shown) such as, but not limited to, bolts.

In some embodiments, the handle assembly 68 may remain attached to the component base 66 following attachment of the component base 66 to the electronics base 22 via the fasteners 140. In other embodiments, the handle assembly 68 may be removed once the component base 66 is installed. Of course, the handle assembly 68 may later be reattached to the component base 66 for removing the component base from the electronics base 22.

Figure 17:
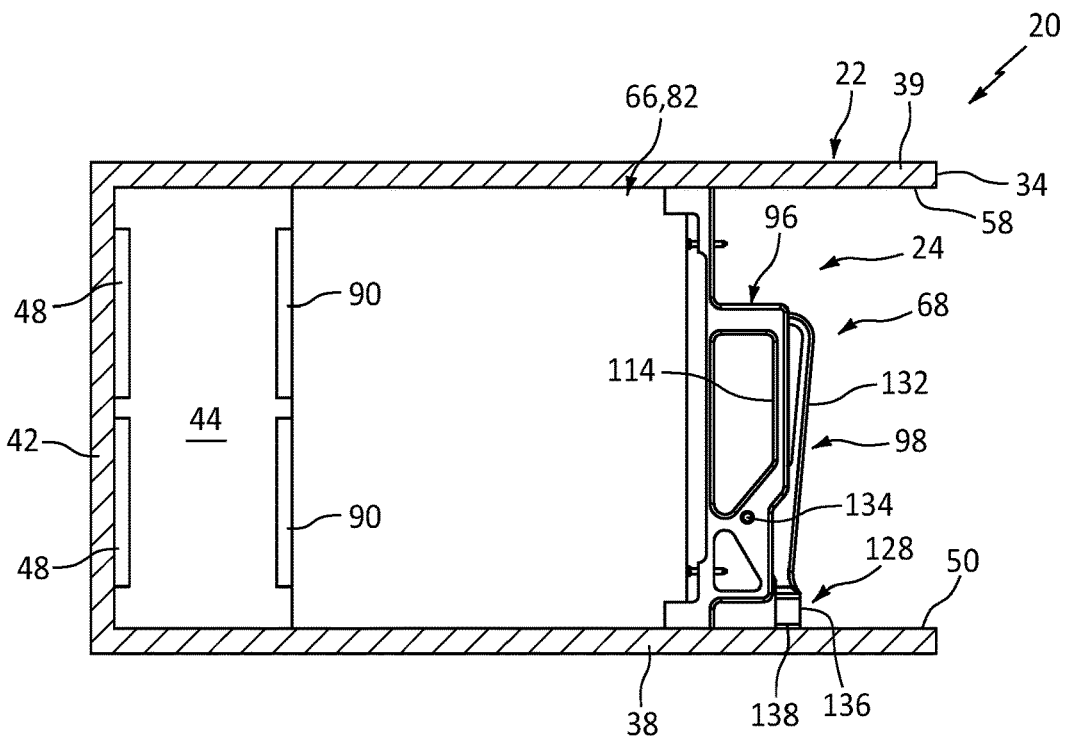
FIG. 17 is a side sectional illustration of the electronic system assembly with the electronic component at an uninstalled position.
Figure 18:
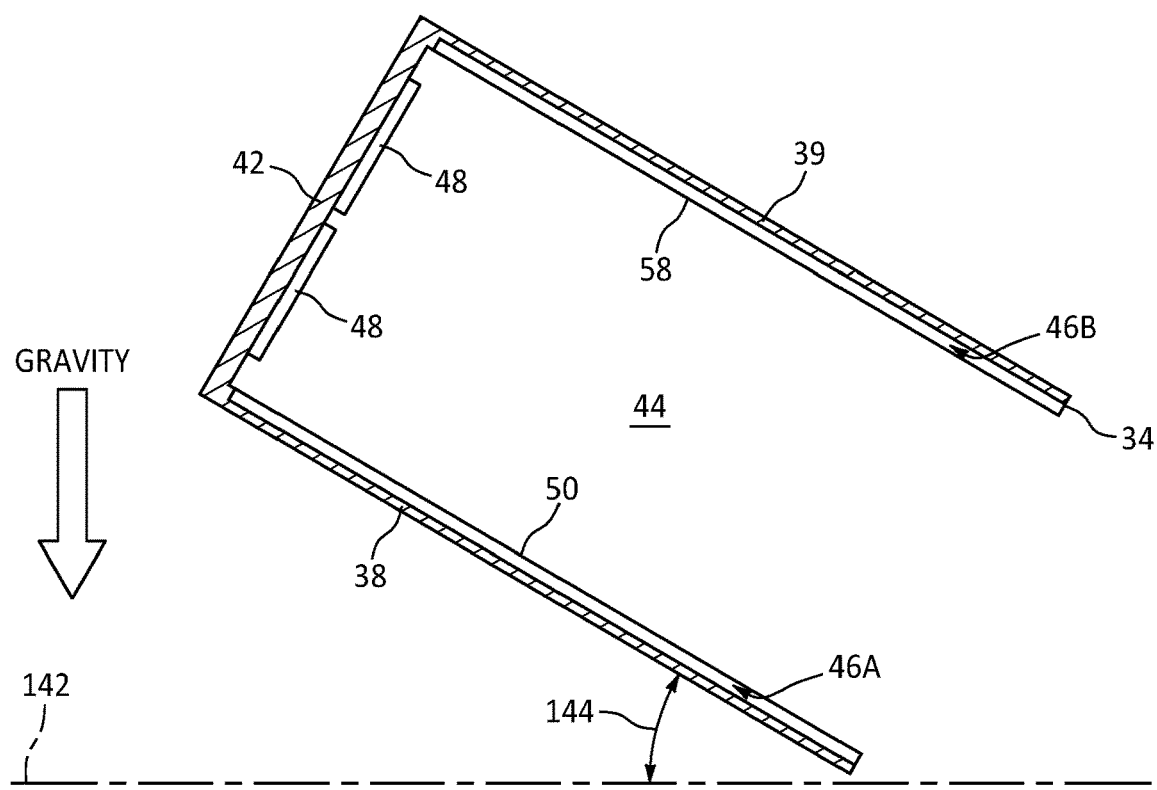
FIG. 18 is a side sectional illustration of the electronics base with a tilted orientation.

While the brake 128 is described as being engaged once the electronic component 24 is at its installed position, the brake 128 may also or alternatively be engaged at various other positions within the electronics base 22 and its component bay 44 as the electronic component 24 is moved (e.g., slid) along the guides 46. For example, referring to FIG. 17, the brake 128 may be engaged at numerous uninstalled positions where the connectors 48 and 90 are disengaged (e.g., decoupled, disconnected) from one another. Thus, even if the operator were to temporarily release or lose grip of the handle assembly 68, the automatic engagement of the brake 128 would hold the electronic component 24 in place. Referring to FIG. 18, this may be particularly useful where the electronics base 22 is tilted relative to a gravitational horizon line 142; e.g., where (e.g., centerlines of) the guides 46 and/or where (e.g., surfaces of) the walls 38 and 39 are angularly offset form the gravitational horizon line by an acute angle 144.

In some embodiments, even where the brake 128 is engaged, the brake 128 may be configured to permit movement of the electronic component 24 towards the installed position (e.g., see FIGS. 15 and 16). For example, the brake pad 138 may slide, skip and/or otherwise move along the bottom wall surface 50. However, where the electronic component 24 is moved away from the installed position, the brake 128 may be wedged into its holding position and thereby prevent further movement.

The foregoing steps of the method 1100 may be repeated to install additional electronic components 24 within the component bay 44. Furthermore, the foregoing steps may be reversed (e.g., performed in an opposite order) to remove (e.g., uninstall) one or more of the electronic components 24 from the electronics base 22.

While various embodiments of the present disclosure have been described, it will be apparent to those of ordinary skill in the art that many more embodiments and implementations are possible within the scope of the disclosure. For example, the present disclosure as described herein includes several aspects and embodiments that include particular features. Although these features may be described individually, it is within the scope of the present disclosure that some or all of these features may be combined with any one of the aspects and remain within the scope of the disclosure. Accordingly, the present disclosure is not to be restricted except in light of the attached claims and their equivalents.

What is claimed is:

1. An assembly for an electronic system, comprising:
   a base including a base connector, a bay and a first guide, the first guide arranged along a first side of the bay; and
   an electronic component configured to mate with the first guide and to move along the first guide within the bay to an installed position, the electronic component including a component connector and a brake, the component connector configured to couple with the base connector when the electronic component is at the installed position, and the brake engageable as the electronic component moves along the first guide to the installed position;
   wherein the electronic component further includes a handle base and a handle lever; wherein the handle lever is pivotally connected to the handle base at an intermediate position between a first end of the handle lever and a second end of the handle lever; and wherein the handle lever comprises the brake at the first end of the handle lever.

2. The assembly of claim 1, wherein, when the brake is engaged, the brake is configured to positionally fix the electronic component within the bay.

3. The assembly of claim 1, wherein
the brake is configured to hold the electronic component at an uninstalled position along the first guide; and
the component connector is uncoupled from the base connector when the electronic component is at the uninstalled position.

4. The assembly of claim 1, wherein the brake is configured to hold the electronic component at the installed position.

5. The assembly of claim 1, wherein
the electronic component further includes a handle assembly;
the handle assembly includes the handle base and the handle lever; and
the brake is actuatable by squeezing the handle assembly.

6. The assembly of claim 1, wherein
the electronic component further includes a handle assembly;
the handle assembly includes the handle base and the handle lever; and
the brake is disengageable by squeezing the handle assembly.

7. The assembly of claim 1, wherein, when the brake is engaged, the brake is configured to
allow movement of the electronic component along the first guide towards the installed position; and
prevent movement of the electronic component along the first guide away from the installed position.

8. The assembly of claim 1, wherein the brake is configured to disengage when the electronic component is pushed along the first guide towards the installed position.

9. The assembly of claim 1, wherein, when the brake is engaged, the brake is configured to press against a surface of the base at the first side of the bay.

10. The assembly of claim 1, wherein
the electronic component further includes a biasing device; and
the biasing device is engaged with and located between the handle base and the handle lever at the second end of the handle lever.

11. The assembly of claim 1, wherein the brake comprises a friction pad.

12. The assembly of claim 1, wherein
the base comprises a rack configured to hold a plurality of electronic modules within the bay; and
the electronic component comprises a first of the plurality of electronic modules.

13. The assembly of claim 1, wherein
the base further includes a second guide arranged along a second side of the bay; and
the electronic component is configured to mate with the second guide and to move along the second guide within the bay to the installed position.

14. The assembly of claim 1, wherein
the first guide comprises a slot; and
the electronic component further includes a slider that projects into and is slidable within the slot when the electronic component is mated with the first guide.

15. The assembly of claim 1, wherein the first guide is angularly offset from a gravitational horizon line by an acute angle.

16. An assembly for an electronic system, comprising:
an electronics base including a base connector and a bay; and
an electronic component including a component connector, a brake and a handle assembly, the component connector configured to couple with the base connector when the electronic component is within the electronics base, and the brake configured to hold a position of the electronic component within the bay, wherein the brake is actuatable by squeezing the handle assembly;
wherein the handle assembly includes a handle base and a handle lever;
wherein the handle lever is pivotally connected to the handle base by a pivot connection; and
wherein the brake is configured with the handle lever and located to a side of the pivot connection.

17. The assembly of claim 16, wherein
the handle assembly further includes a spring device; and
the spring device is located to a first side of the pivot connection, and the spring device is engaged with and between the handle base and the handle lever.

18. The assembly of claim 17, wherein the brake is configured to permit movement of the electronic component within the bay when the handle base and the handle lever are squeezed together on the first side of the pivot connection.

19. The assembly of claim 16, wherein the brake is configured to hold the position of the electronic component within the bay when the electronic component is at
an installed position where the component connector is coupled with the base connector; and
an uninstalled position where the component connected is uncoupled from the base connector.

20. A method for servicing an electronic system, comprising:
providing an electronic component within a bay of an electronic base, wherein the electronics base includes a base connector and a first guide, the electronic component includes a component connector, a brake and a handle assembly, the component connector is configured to couple with the base connector when the electronic component is at an installed position, and the electronic component is configured to move along the first guide within the bay to the installed position; and
squeezing the handle assembly to disengage the brake and permit movement of the electronic component within the bay;
wherein the handle assembly includes a handle base and a handle lever;
wherein the handle lever is pivotally connected to the handle base by a pivot connection; and
wherein the brake is configured with the handle lever and located to a side of the pivot connection.

* * * * *